(12) United States Patent
Swanson et al.

(10) Patent No.: US 6,707,460 B1
(45) Date of Patent: Mar. 16, 2004

(54) FAST AND CHEAP CORRECT RESOLUTION CONVERSION FOR DIGITAL NUMBERS

(75) Inventors: Roger Swanson, Morgan Hill, CA (US); Daniel Hung, Santa Clara, CA (US)

(73) Assignee: S3 Graphics Co., Ltd., Cayman Islands (KY)

( * ) Notice: Subject to any disclaimer, the term of this patent is extended or adjusted under 35 U.S.C. 154(b) by 341 days.

(21) Appl. No.: 09/860,417

(22) Filed: May 18, 2001

Related U.S. Application Data

(60) Provisional application No. 60/205,637, filed on May 18, 2000.

(51) Int. Cl.[7] .................................................. G09G 5/02
(52) U.S. Cl. ....................................................... 345/605
(58) Field of Search ................................ 345/600–602, 345/605

(56) References Cited

U.S. PATENT DOCUMENTS

| | | | | |
|---|---|---|---|---|
| 4,031,378 A | * | 6/1977 | Le Comte | 235/164 |
| 5,402,369 A | * | 3/1995 | Main | 364/757 |
| 6,064,367 A | * | 5/2000 | Horioka | 345/155 |
| 6,513,055 B1 | * | 1/2003 | Boran | 708/551 |

* cited by examiner

*Primary Examiner*—Matthew C. Bella
*Assistant Examiner*—G. F. Cunningham
(74) *Attorney, Agent, or Firm*—Carr & Ferrell LLP

(57) ABSTRACT

A method and apparatus for converting an N-bit resolution input to an M-bit resolution output is provided. Upon receiving an original input having an N-bit input sequence, the method and apparatus generates an (N+M)-bit sequence by repeating the N-bit input sequence in the original input. A new M-bit sequence is generated by taking M Most Significant Bits from the (N+M)-bit sequence, and a new N-bit sequence is formed by taking N Most Least Significant Bits from the (N+M)-bit sequence. The M-bit resolution output is then formed by adjusting the new M-bit sequence based on the difference between the new N-bit sequence and the N-bit input sequence.

28 Claims, 4 Drawing Sheets

```
#include <iostream.h>
#include <math.h>
include <assert.h> void conversion(unsigned int input,   unsigned int inputResolution,
                unsigned int &output, unsigned int outputResolution) {
    unsigned int v1,v2,v4;
    int v3;

assert(inputResolution<outputResolution);

// calculate v1 = input w/ bit pattern repeated at LSBs
    {
        unsigned int repetition = ( (inputResolution + outputResolution)
            / inputResolution ) - 1;
        unsigned int shift = (inputResolution + outputResolution)
            % inputResolution;
        unsigned int i;
        for (v1=input,i=0;i<repetition;i++) {
            v1 <<= inputResolution;
            v1 |= input;
        }
        v1 <<= shift;
        v1 |= ( input >> (inputResolution - shift) );
    }

// calculate v2 = inputResolution LSBs of v1
    {
        unsigned int mask = (1 << inputResolution)-1;
        v2 = v1 & mask;
    }

// calculate v3 = v2 - input;
    v3 = v2 - input;

// calculate v4 = outputResolution MSBs of v1
    {
        unsigned int mask = (1 << outputResolution)-1;
        mask <<= inputResolution;
        v4 = v1 & mask;
    }

// result
    {
        int positiveOneHalf = 1 << (inputResolution - 1);
        int negativeOneHalf = -positiveOneHalf;
        unsigned int lSB = 1 << inputResolution;

v4 = (v3 < negativeOneHalf) ? (v4 - lSB) :
             ( (v3 > positiveOneHalf) ? (v4 + lSB) :
               (v4) );
        output = v4 >> inputResolution;
    }
} void main() {
    double a,b;

for (a = 0.0;a<1.0;a+=.1) {
        unsigned int uint;
        conversion((unsigned int)(a*0xff),8,uint,20);
        b = (double)uint/(double)0xffffff;
        cout << a << "\t" << b << endl;
    }
}
```

FIG. 4

FAST AND CHEAP CORRECT RESOLUTION CONVERSION FOR DIGITAL NUMBERS

CROSS-REFERENCES TO RELATED APPLICATION

This application claims the benefit of Provisional Patent Application Ser. No. 60/205,637, filed on May 18, 2000, entitled "Fast and Cheap Correct Resolution Conversion for Digital Numbers," the subject matter of which is herein incorporated by reference.

BACKGROUND OF THE INVENTION

1. Field of the Invention

The present invention relates generally to graphics systems, and more particularly to conversion of digital numbers to change resolutions for graphics systems.

2. Description of Related Art

A digital color image represented in a graphics system is composed of a large number of array of pixels. Each pixel in the array is associated with position and color information. The position information indicates the position of a pixel in the array, and the color information includes three basic colors (red, green and blue) so that the composite of the three basic colors attains a desired color for the pixel. The intensity of a basic color is represented by a digital number having a certain number of binary bits (or resolution).

Because resolutions may often differ at various points of graphical computation, conversion of visual attributes from one resolution to another is a common operation in graphics systems. Usually, color attributes in graphic systems are normalized within a range from 0.1 to 1.0. As an example, considering the intensity of the color red as a visual attribute, "no redness" can be represented as 0.0 and the "highest red intensity" as 1.0. If a four-bit resolution is used at a certain point of graphical computation, the intensity value of red can be represented by a binary value ranging from 0.0000 to 0.1111.

Several methods exist for converting a digital number from one resolution to another. One such method is to add trailing zeros at the end of a digital number to obtain a higher resolution, and to truncate it to get a lower resolution. An exemplary conversion from a 4-bit resolution to a 10-bit resolution is illustrated in Table I as follows:

TABLE I

| | |
|---|---|
| Original value: | .abcd |
| Extend resolution by adding trailing "0"s | |
| Final value: | .abcd000000 |

The basic approach described above would be acceptable if number range is always from "0.0000 . . . " to "1.0000 . . . ", where the dots after a digital number represent trailing significant bits. However, in many graphics systems, a binary value "1.0000 . . . " is actually represented as "0.1111 . . . " Consequently, simple additions of trailing zeros and truncations in resolution conversion may produce skewed results.

However, some of the skewed effects can be corrected by multiplying a conversion number $(2^N)/(2^N-1)$ with the original value, where N is the number of bits in the original value. It should be noted that $(2^N)/(2^N-1)$ can be an indefinite repeating binary value. For example, when N is equal to 4, $(2^4)/(2^4-1)$ is equal to a binary value of "1.000100010001 . . . " Therefore, an exemplary conversion from a 4-bit resolution to a 10-bit resolution with correction can be illustrated in Table II as follows:

TABLE II

| | |
|---|---|
| Original value: | .abcd |
| Conversion number: | $(2 \wedge 4)/(2 \wedge 4 - 1) = 1.000100010001....$ |
| Extended resolution: | .abcd × 1.000100010001.... |
| Extended value: | .abcd.... |
| Final value: | rounded extended-value |

However, the conversion with correction process shown above is not complete because the truncation to the extended value assumes that the extended value is always represented in a range from "0.0000 . . . " to "1.0000 . . . ". As previously discussed, many graphics systems represent a binary value "1.0000 . . . " as "0.1111 . . . " Therefore, the final value needs to be converted back to the range from "0.0000 . . . " to "0.1111 . . . " This conversion can be achieved by applying a range-conversion value $(2^M-1)/(2^M)$, where M is the number of bits in the resulting resolution. Therefore, an exemplary conversion from a 4-bit resolution to a 10-bit resolution with correction and range-conversion can be illustrated in Table III as follows:

TABLE III

| | |
|---|---|
| Original value: | .abcd |
| Conversion number: | $(2 \wedge 4)/(2 \wedge 4 - 1) = 1.000100010001....$ |
| Extended resolution: | .abcd × 1.000100010001.... |
| Truncated value: | .abcd.... |
| Range-conversion: | $(.abcd....) \times (2 \wedge 10 - 1)/(2 \wedge 10)$ |
| Final value: | rounded range-conversion value |

The conversion with correction and range-conversion process shown above requires two multiplies, one being $(2^N)/(2^N-1)$ and the other being $(2^M-1)/(2^M)$. Because either one of the two multiplies can be an indefinite binary number, the result of the two multiplications can also be an indefinite binary number. Since no digital system can be built to process indefinite numbers, the conversion with correction and range-conversion process described above is difficult to implement. This conversion process is further complicated when the first multiplication generates an indefinite binary value, which would then require the retention of enough bits to avoid carry propagation problems.

Therefore, there is a need for an improved apparatus and method to perform resolution conversion that requires less number of bits in implementing a digital system.

SUMMARY OF THE INVENTION

The present invention provides a novel method and apparatus for converting an input having an N-bit resolution to an output having an M-bit resolution. Upon receiving an original input having an N-bit input sequence, the method and apparatus generates an (N+M)-bit sequence by repeating the N-bit input sequence in the original input. A new M-bit sequence is generated by taking M Most Significant Bits from the (N+M)-bit sequence, and a new N-bit sequence is formed by taking N Most Least Significant Bits from the (N+M)-bit sequence. The M-bit resolution output is then formed by adjusting the new M-bit sequence based on the difference between the new N-bit sequence and the N-bit input sequence.

The apparatus of the present invention performs the resolution conversion process within a graphics engine of a computing device. The graphics engine includes a data module, a conversion module and a correction module. The data module receives the initial resolution data for an image and forwards the information to the conversion module, which subsequent converts the initial resolution data into a final resolution-bit sequence. The final resolution-bit sequence is then adjusted by the correction module to obtain final resolution data.

BRIEF DESCRIPTION OF THE DRAWINGS

FIG. 4. is an exemplary embodiment of source code for performing the method of FIG. 3.

DESCRIPTION OF THE PREFERRED EMBODIMENT

Figure 1:
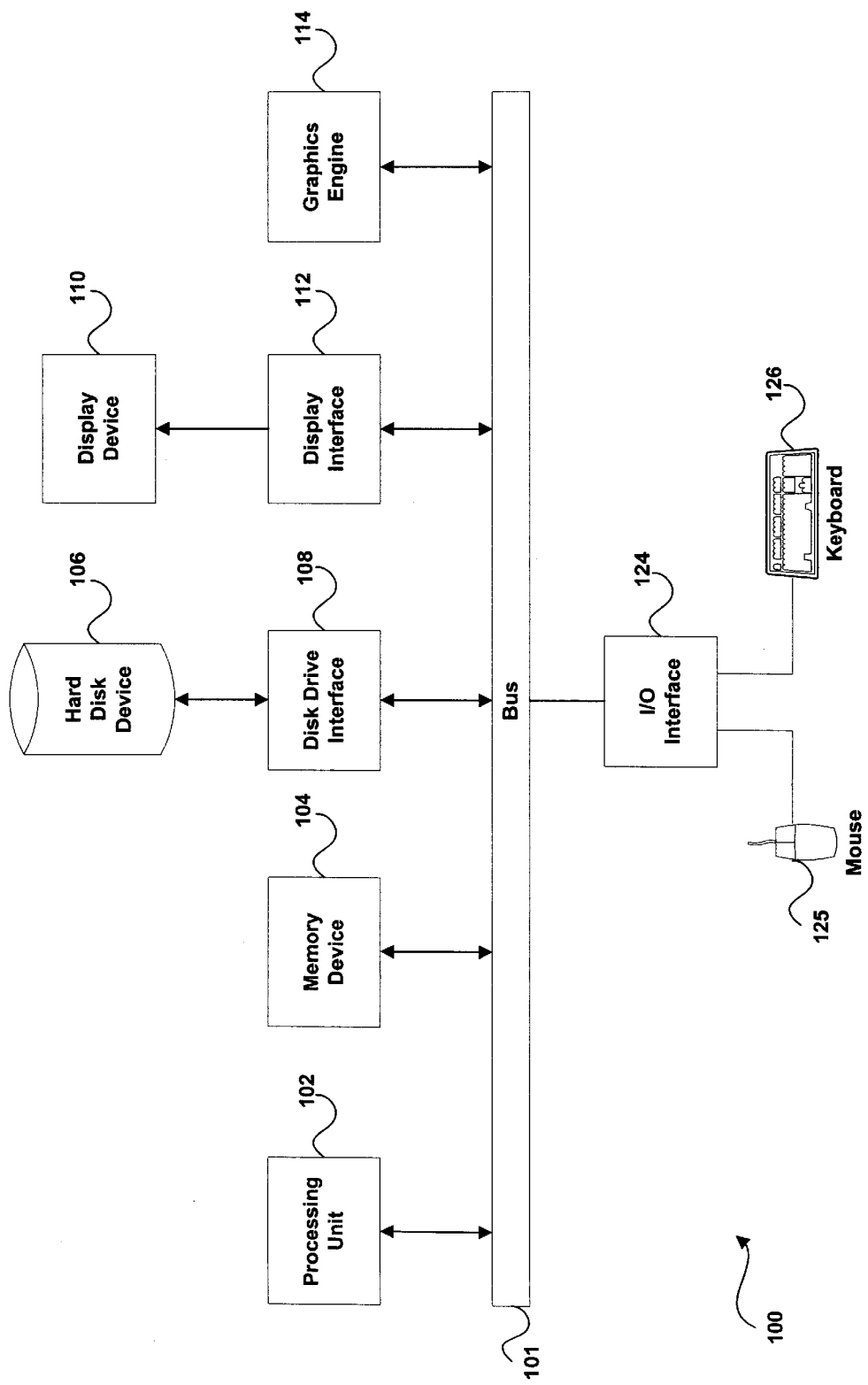
FIG. 1 is a block diagram of an exemplary computer system for implementing resolution conversion in accordance with the present invention.

FIG. 1 is a block diagram of an exemplary computer system 100 for implementing resolution conversion, in accordance with the present invention. The computer system 100 includes a processing unit 102, a memory device 104, a hard disk device 106, a disk drive interface 108, a display device 110, a display interface 112, a graphics engine 114, an input and output (I/O) interface 124, a mouse 125, and a keyboard 126. All these components are coupled to a system bus 101. The memory device 104 is able to store programs including instructions and data. Operating together with the disk drive interface 108, the hard disk device 106 is also able to store programs including instructions and data. However, the memory device 104 has faster access speed than the hard disk device 106, while the hard disk device 106 has higher capacity than the memory device 104. The display device 110 is able to provide visual interfaces between the programs running on the computer system 100 and a user through the display interface 112. Under the control of the processing unit 102, the graphic engine 114 is capable of converting bit resolution in accordance with the present invention. Finally, the I/O interface 124 allows the mouse 125, the keyboard 126, or any other input/output devices to provide input into to or receive output from the computer system 100.

The processing unit 102, which may include one or more processors, has access to the memory device 104 and hard disk device 106, and is able to control the operations of the computer system 100 by executing the programs that are stored in either the memory device 104 or the hard disk device 106. The processing unit 102 may also control the transmissions of programs and data between the memory device 104 and the hard disk device 106. The processor unit 102 further includes an ALU (Arithmetic and Logic Unit) 103 for performing addition, subtraction, multiplication, shifting, masking, logic AND, logic OR, and other operations.

Figure 2:
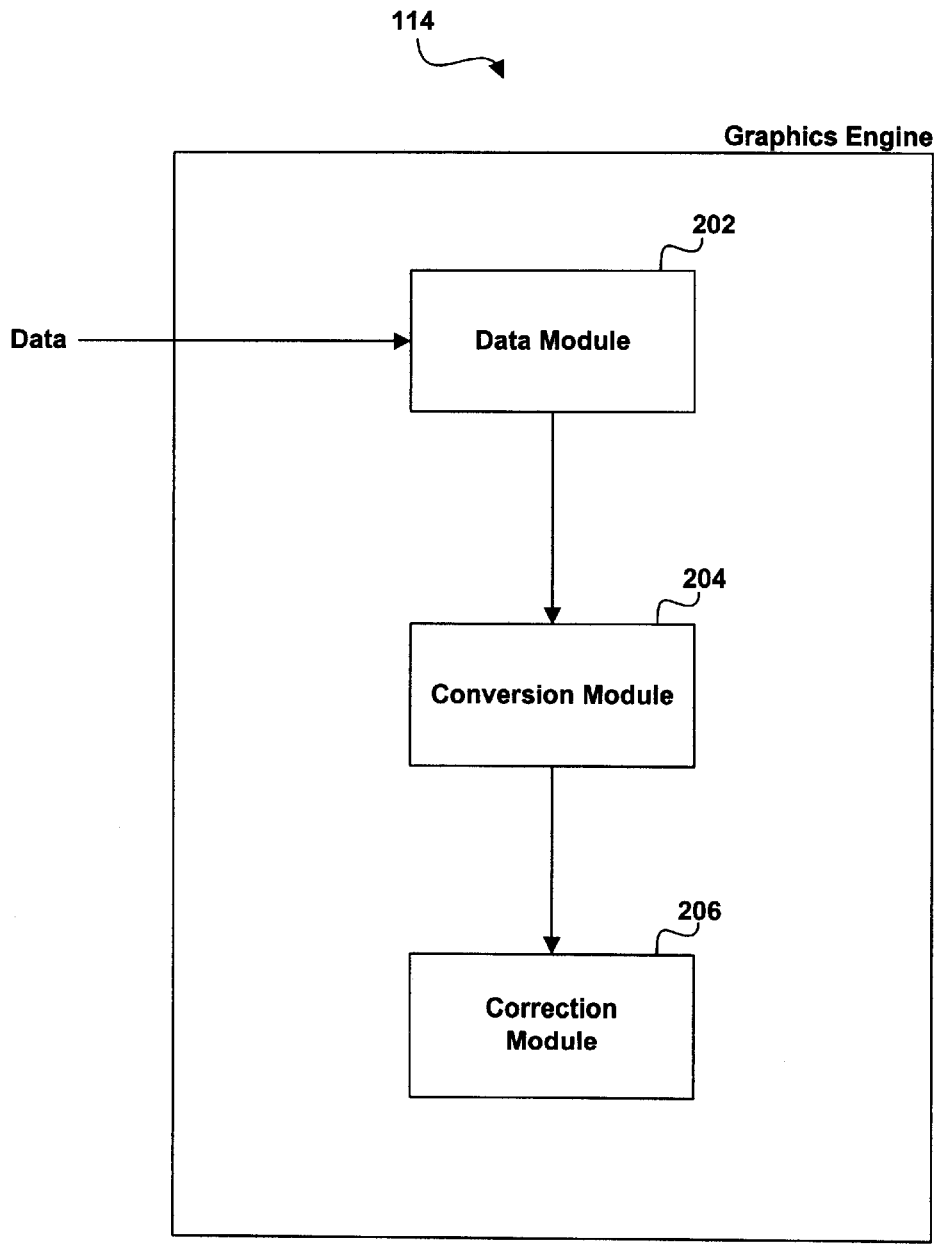
FIG. 2 is a block diagram illustrating the graphic engine of FIG. 1 in further details, in accordance with the present invention.

FIG. 2 is a block diagram illustrating the graphics engine 114 of FIG. 1 in further details. The graphics engine 114 may include a data module 202, a conversion module 204, and a correction module 206.

The data module 202 receives and stores data for all pixels in a color image. Each pixel in the data module 202 is associated with position and color information. The color information includes three basic colors of red, green and blue. Each basic color is originally represented by an N-bit digital number.

The conversion module 204 receives data from the data module 202 and converts the resolution for all the pixels contained in the color image. After conversion, each of the three basic colors for a pixel will be represented by an M-bit digital number. The correction module 206 receives converted data from the conversion module 204 and performs bit correction to the converted data. Specifically, the correction module 206 may correct the converted data by adjusting the converted data by a LSB (Least Significant Bit). The conversion and correction process will be discussed in more detail below.

It should be noted that the graphics engine 114 shown in FIG. 2 is an exemplary embodiment of the present invention. It may be implemented on a graphic card, which may contain its own internal bus, processor and memory. Alternatively, the graphics engine 114 may be implemented as a pure software module, which can be stored in either the memory device 104 or hard disk device 106.

To better understand the specific steps in the conversion process of the present invention, it is helpful to first describe the principle behind this conversion process. The principle of the present invention can be more clearly demonstrated by an example converting an original 4-bit sequence ".abcd" from a 4-bit resolution (N=4) into a 10-bit resolution (M=10).

In the current example, the 4-bit resolution may be increased by multiplying the original sequence ".abcd" with a conversion number $(2^N)/(2^N-1)$, where $(2^N)/(2^N-1)=(2^4)/(2^4-1)=16/15=$"1.000100010001 . . . " However $(2^4)/(2^4-1)$ is an indefinite repeating binary value, the present invention represents ".abcd×$(2^4)/(2^4-1)$" as an indefinite repeating binary value. Therefore, the present invention generates an extended sequence (a first middle value) by repeating the original sequence as illustrated in Table IV as follows:

TABLE IV

| | |
|---|---|
| Original value: | .abcd |
| Conversion number: | $(2^4)/(2^4-1)$ = 1.000100010001.... |
| Extended resolution: | .abcd × 1.000100010001.... |
| First middle value: | .abcdabcdabcdabcd.... |

As previously discussed, the first middle value needs to be converted to a range from "0.0000 . . . " to "0.1111 . . . " by multiplying the first middle value with $(2^M-1)/(2^M)$. Therefore, an exemplary conversion from a 4-bit resolution to a 10-bit resolution with correction and range-conversion is illustrated in Table V as follows:

TABLE V

| | |
|---|---|
| Original value: | .abcd |
| Conversion number: | $(2^N)/(2^N-1) = (2^4)/(2^4-1)$ = 1.000100010001.... |
| Extended resolution: | .abcd × 1.000100010001.... |
| First middle value: | .abcdabcdabcdabcd.... |
| Second middle value: (with converted range) | ".abcdabcdabcdabcd...." × $(2^M-1)/(2^M)$ |
| Final value: | rounded second middle value to 10 bits (M = 10) | wherein $(2^M-1)/(2^M)=(2^{10}-1)/2^{10}=1023/1024$ in the present example.

In the algorithm described in Table V, the key is how to select a minimum number of bits for implementing an actual digital system. To better understand the bit number selection process of the present invention, the first and second middle values need to be reconstructed. Thus, the first middle value ".abcdabcdabcd . . ." shown in Table V is reconstructed as:

$$.abcdabcdabcd\ldots = .abcdabcdab + 0.0000000000cdabcdabcd \quad (1)$$

Because $1023/1024 = (1-1/1024)$, by replacing (1023/1024) with (1-1/1024), the second middle value shown in Table V can be reconstructed as:

$$(.abcdabcdabcd\ldots) \times 1023/1024 = (.abcdabcdabcd\ldots) \times (1-1/1024) = (.abcdabcdabcd\ldots) - (.abcdabcdabcd\ldots) \times 1/1024 \quad (2)$$

Further, since 1/1024 is equal to a binary value of 0.0000000001, the second middle value can be represented as:

$$.abcdabcdabcd\ldots - 0.0000000000abcdabcdabcd \quad (3)$$

By replacing ".abcdabcdabcd . . ." in equation (2) with ".abcdabcdab+0.0000000000cdabcdabcd . . ." in equation (1), the second middle value becomes:

$$.abcdabcdab + (0.0000000000cdabcdabcdab\ldots - 0.0000000000abcdabcdabcd\ldots) \quad (4)$$

The formula (4) includes three parts, namely, ".abcdabcdab", "0.0000000000cdabcdabcdab . . .", and "0.0000000000abcdabcdabcd . . ." The subtraction between the second and third parts in formula (4) can only change the first part by ±1 LSB (Least Significant Bit) (i.e., by adding 1 to, or subtracting 1 from, the LSB position in the first part). Therefore, the second middle value can be represented in a programming language clause as:

$$abcdabcdab + (+1 \text{ LSB if } (.cdab\ldots - .abcd\ldots) \geq \tfrac{1}{2} - 1 \text{ LSB if } (.cdab\ldots - .abcd\ldots) \leq -\tfrac{1}{2} 0 \text{ otherwise}) \quad (5)$$

In algorithm(5), because each of the four sequences (i.e., ".cdab . . .", ".abcd . . .", ".cdab . . ." or ".abcd . . .") within the two brackets is an indefinite binary value, the subtraction operations may generate uncertain logic conditions for the two "if" clauses. Further, when the subtraction result is at ½ point, algorithm (5) may generate an uncertain rounding result for the second middle value. The present invention solves both of these problems by applying a conversion operation (i.e., $(2^N)/(2^N-1)=16/15$ where N=4) to the four sequences. Thus, the two "if" clauses in algorithm (5) becomes:

$$(+1 \text{ LSB if } (.cdab \times (16/15) - .abcd \times (16/15)) \geq \tfrac{1}{2} - 1 \text{ LSB if } (.cdab \times (16/15) - .abcd \times (16/15)) \leq -\tfrac{1}{2} 0 \text{ otherwise}) \quad (6)$$

In algorithm (6), the four sequences within the two brackets may still be indefinite binary values. To remove (16/15) from the left-hand side of the two "compare signs" (i.e., "$\geq$" and "$\leq$"), a value of (15/16) is multiplied to both sides of the "compare signs." Thus, algorithm (6) becomes:

$$(+1 \text{ LSB if } (.cdab - (16/15) \times (15/16) - .abcd \times (16/15) \times (15/16)) \geq \tfrac{1}{2} \times 15/16 - 1 \text{ LSB if } (.cdab \times (16/15) \times (15/16) - .abcd \times (16/15) \times (15/16)) \leq -\tfrac{1}{2} \times 15/16 \; 0 \text{ otherwise}) \quad (7)$$

Simplifying algorithm (6), it becomes:

$$(+1 \text{ LSB if } (.cdab - .abcd) \geq \tfrac{1}{2} \times 15/16 - 1 \text{ LSB if } (.cdab - .abcd) \leq \tfrac{1}{2} \times 15/16 \; 0 \text{ otherwise}) \quad (8)$$

Because 15/16 is equal to 0.10100100 . . . , the algorithm can be represented as:

$$(+1 \text{ LSB if } (.cdab - .abcd) \geq \tfrac{1}{2} \times 0.10100100\ldots -1 \text{ LSB if } (.cdab - .abcd) \leq \tfrac{1}{2} \times 0.10100100\ldots 0 \text{ otherwise}) \quad (9)$$

Inalgorithm (9), the four indefinite sequences in algorithm (5) are replaced by four 4-bit sequences (i.e., ".cdab", ".abcd", ".cdab", and ".abcd"). Because the subtractions within the two brackets can never generate more than 4 fractional bits of accuracy, the equal case in algorithm (9) never occurs. Since the infinitely repeating parts may only be in compare values, the infinitely repeating parts may be discarded by excluding the equality case from the algorithm (9). Therefore, algorithm (9) becomes:

$$(+1 \text{ LSB if } (.cdab - .abcd) > \tfrac{1}{2} - 1 \text{ LSB if } (.cdab - .abcd) < \tfrac{1}{2} 0 \text{ otherwise}) \quad (10)$$

Alternatively, algorithm (10) may be represented as:

$$s.wxyz = (.cdba - .abcd) + 1 \text{ LSB if } (s.w=0.1) \text{ and } (xyz!=000) - 1 \text{ LSB if } s.w=1.0 \; 0 \text{ otherwise} \quad (11)$$

where s is the sign bit of the subtraction (i.e., .cdba−.abcd), and wxyz is the four resulting bits from the subtraction. It should be noted that the calculation in algorithm (11) is different than first calculating (.abcdabcdabcdab−0.0000000000abcd) and then rounding to the nearest value by adding 0.00000000001 when (.cdab−.abcd)=½.

Figure 3:
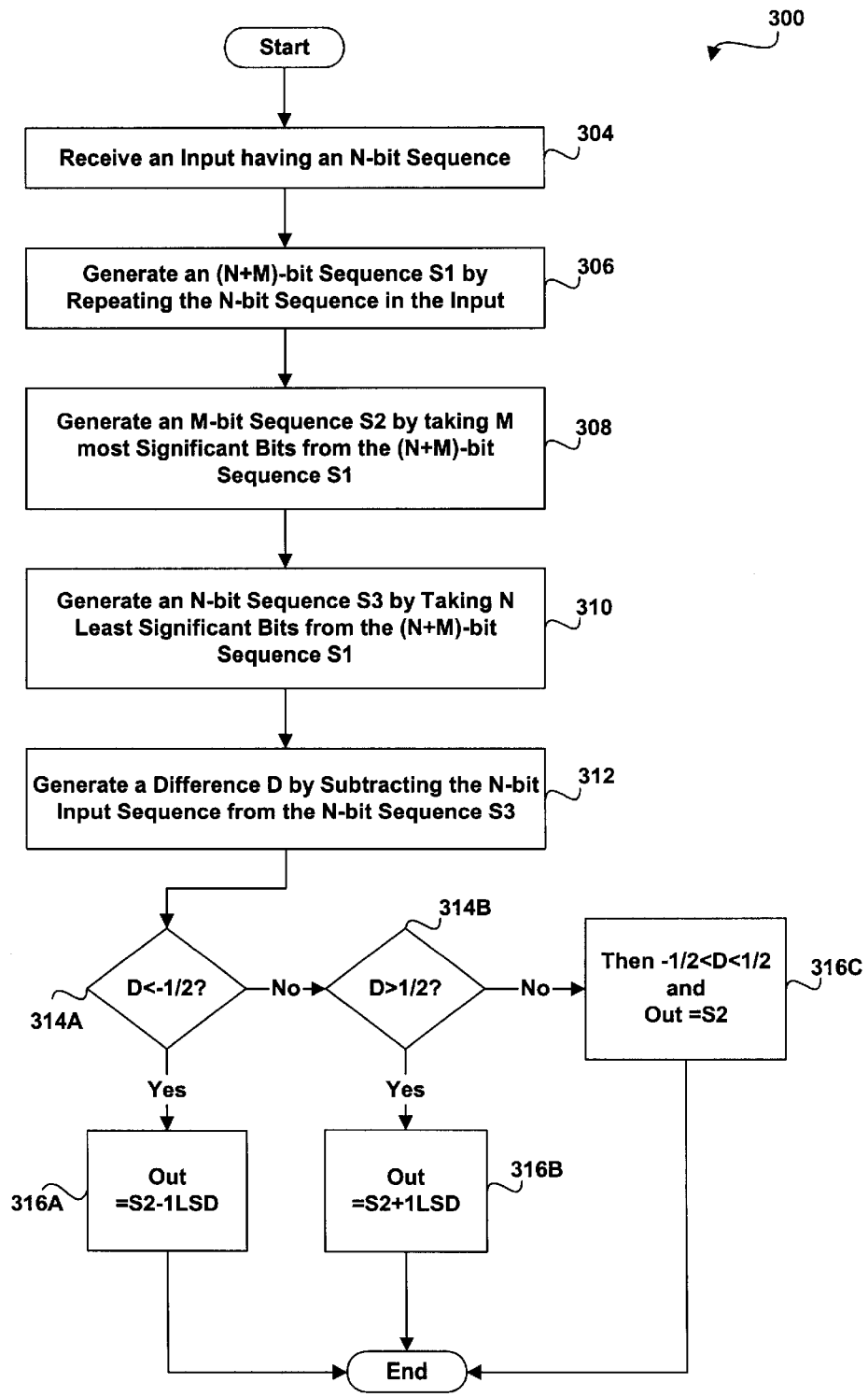
FIG. 3 is a flowchart illustrating an exemplary process for converting an N-bit resolution to an M-bit resolution, in accordance with the present invention.

The discussion above sets up the principle to describe the following resolution conversion process of the present invention. FIG. 3 is a flowchart 300 illustrating an exemplary process of converting an N-bit resolution for one basic color in a pixel into an M-bit resolution, in accordance with the present invention.

Instep 304, the conversion module 204 (FIG. 2) in the graphics engine 114 (FIG. 1) receives a digital number input, IN, having an N-bit sequence from the data module 202 (FIG. 2). The conversion module 204 then generates an (M+N)-bit sequence S1, in step 306 by repeating the N-bit sequence of the input IN. For example, with an input sequence of "abcd" (N=4), a 14-bit sequence of "abcdabcdabcdab" (M=10, N+M=14) is formed by repeating the input sequence "abcd" three and half times; that is, "abcd", "abcd", "abcd", and "ab". As a specific implementation, the "abcdabcdabcdab" sequence can be formed by shifting the input sequence "abcd" four times. But in the last shift, only the first two bits in the input sequence "abcd" are applied to the 14-bit sequence. Next in step 308, the conversion module 204 generates an M-bit sequence, S2, by taking M Most Significant Bits from the (M+N)-bit sequence, S1, of step 306. In step 310, the conversion module 204 generates an N-bit sequence, S3, by taking the N Least Significant Bit from the (M+N)-bit sequence, S1, of step 306.

Subsequently in step 312, the correction module 206 (FIG. 2) in the graphics engine 114 (FIG. 1) generates a difference value, D, between the N-bit input and the N-bit sequence, S3, of step 310. The correction module 206 then determines whether the difference value is less than −½, greater than ½, or within a range between −½ and ½. If the difference value is less than −½, the correction module 206 generates an M-bit output, OUT, by subtracting 1 from the Least Significant Bit (LSB) in the M-bit sequence, S2, in step 316A. Alternatively, if the difference is within the range between −½ and ½, then the correction module 206 generates the M-bit output, OUT, by directly using the M-bit sequence, S2, in step 316C. Finally, if the difference is greater than ½, the correction module 206 generates the M-bit output, OUT, by adding 1 to the Least Significant Bit (LSB) in the M-bit sequence, S2, in step 316B.

It should be noted that steps in FIG. 3 only show the resolution conversion process for one basic color in one pixel. The process shown in FIG. 3 repeats until the resolution of the basic colors for all the pixels in the color image are converted. During or after conversion, the pixels with converted resolution can be displayed on the display device 110 in a higher color resolution.

FIG. 4 illustrates a C Language source code for performing the process shown in FIG. 3.

The present invention has been described above with reference to specific embodiments. It will be apparent to those skilled in the art that varies modifications may be made and other embodiments can be used without departing from the spirit of the present invention. For example, even though the preferred embodiment is described with respect to converting an N-bit input resolution (N=4) to an M-bit output resolution (M=10), the principle of the present invention applies to any arbitrary N and M. Further, even though the process as shown in FIG. 3 illustrates the generation of three sequences S1, S2 and S3 in a sequential order, these three sequences may be performed in any other order. Therefore, these and other variations upon the specific embodiments are intended to be covered by the present invention, which is only limited by the appended claims.

What is claimed is:

1. A method for converting an N-bit resolution to an M-bit resolution, comprising the steps of:

receiving image data having an N-bit resolution and being characterized by an N-bit input sequence;

generating an (M+N)-bit sequence by repeating the N-bit input sequence;

generating an M-bit sequence from the (M+N)-bit sequence;

generating an N-bit sequence from the (M+N)-bit sequence; and generating the M-bit resolution by adjusting the M-bit sequence based on a comparison between the N-bit sequence and the N-bit input sequence.

2. The method of claim 1, wherein the (M+N)-bit sequence is generated by shifting the N-bit input sequence.

3. The method of claim 1, wherein the M-bit sequence is generated by taking M Most Significant Bits (MSBs) from the (M+N)-bit sequence.

4. The method of claim 1, wherein the N-bit sequence is generated by taking N Least Significant Bits (LSBs) from the (M+N)-bit sequence.

5. The method of claim 1, wherein the M-bit resolution is generated by subtracting 1 from Least Significant Bit (LSB) position in the M-bit sequence, when a difference between the N-bit sequence and the N-bit input sequence is less than $-\frac{1}{2}$.

6. The method of claim 1, wherein the M-bit resolution is set to the M-bit sequence, when a difference between the N-bit sequence and the N-bit input sequence is within a range from $-\frac{1}{2}$ to $-\frac{1}{2}$.

7. The method of claim 1, wherein the M-bit resolution is generated by adding 1 to Least Significant Bit (LSB) position in the M-bit sequence, when the difference between the N-bit sequence and the N-bit input sequence is greater than $\frac{1}{2}$.

8. An apparatus for converting an N-bit resolution to an M-bit resolution, comprising:

receiving means for receiving image data having an N-bit resolution and being characterized by an N-bit input sequence;

first generating means for generating an (M+N)-bit sequence by repeating the N-bit input sequence;

second generating means for generating an M-bit sequence from the (M+N)-bit sequence;

third generating means for generating an N-bit sequence from the (M+N)-bit sequence; and fourth generating means for generating the M-bit resolution by adjusting the M-bit sequence based on a comparison between the N-bit sequence and the N-bit input sequence.

9. The apparatus of claim 8, wherein the first generating means generates the (M+N)-bit sequence by shifting the N-bit input sequence.

10. The apparatus of claim 8, wherein the second generating means generates the M-bit sequence by taking M Most Significant Bits (MSBs) from the (M+N)-bit sequence.

11. The apparatus of claim 8, wherein the third generating means generates the N-bit sequence by taking N Least Significant Bits (LSBs) from the (M+N)-bit sequence.

12. The apparatus of claim 8, wherein the fourth generating means generates the M-bit resolution by subtracting 1 from Least Significant Bit (LSB) position in the M-bit sequence, when a difference between the N-bit sequence and the N-bit input sequence is less than $-\frac{1}{2}$.

13. The apparatus of claim 8, wherein the fourth generating means generates the M-bit resolution by setting to the M-bit sequence, when a difference between the N-bit sequence and the N-bit input sequence is within a range from $-\frac{1}{2}$ to $\frac{1}{2}$1/2.

14. The apparatus of claim 8, wherein the fourth generating means generates the M-bit resolution by adding one to Least Significant Bit (LSB) position in the M-bit sequence, when the difference between the N-bit sequence and the N-bit input sequence is greater than $\frac{1}{2}$.

15. An electronically-readable medium having embodied thereon a program being executable by a machine to perform the method steps for converting an N-bit resolution to an M-bit resolution, the method comprising the steps of:

receiving image data having an N-bit resolution and being characterized by an N-bit input sequence;

generating an (M+N)-bit sequence by repeating the N-bit input sequence;

generating an M-bit sequence from the (M+N)-bit sequence;

generating an N-bit sequence from the (M+N)-bit sequence; and generating the M-bit resolution by adjusting the M-bit sequence based on a comparison between the N-bit sequence and the N-bit input sequence.

16. The electronically-readable medium of claim 15, wherein the (M+N)-bit sequence is generated by shifting the N-bit input sequence.

17. The electronically-readable medium of claim 15, wherein the M-bit sequence is generated by taking M Most Significant Bits (MSBs) from the (M+N)-bit sequence.

18. The electronically-readable medium of claim 15, wherein the N-bit sequence is generated by taking N Least Significant Bits (LSBs) from the (M+N)-bit sequence.

19. The electronically-readable medium of claim 15, wherein the M-bit resolution is generated by subtracting 1 from Least Significant Bit (LSB) position in the M-bit sequence, when a difference between the N-bit sequence and the N-bit input sequence is less than $-\frac{1}{2}$.

20. The electronically-readable medium of claim 15, wherein the M-bit resolution is set to the M-bit sequence, when a difference between the N-bit sequence and the N-bit input sequence is within a range from $-\frac{1}{2}$ to $\frac{1}{2}$.

21. The electronically-readable medium of claim 15, wherein the M-bit resolution is generated by adding 1 to Least Significant Bit (LSB) position in the M-bit sequence, when the difference between the N-bit sequence and the N-bit input sequence is greater than ½.

22. A graphics engine for converting an N-bit resolution to an M-bit resolution, comprising:

a data module for storing data for pixels in an image, each of the pixels being associated with three basic colors and each of the three basic colors being represented by an N-bit digital number characterized by an N-bit input sequence having an N-bit resolution;

a conversion module coupled to the data module for generating M-bit and N-bit sequences based on a calculated (M+N)-bit sequence; and a correction module coupled to the conversion module for generating the M-bit resolution based on a comparison between the N-bit sequence and the N-bit input sequence.

23. The graphics engine of claim 22, wherein the conversion module generates the (M+N)-bit sequence by shifting the N-bit input sequence.

24. The graphics engine of claim 22, wherein the conversion module generates the M-bit sequence by taking M Most Significant Bits (MSBs) from the (M+N)-bit sequence.

25. The graphics engine of claim 22, wherein the conversion module generates the N-bit sequence by taking N Least Significant Bits (LSBs) from the (M+N)-bit sequence.

26. The graphics engine of claim 22, wherein the correction module generates the M-bit resolution by subtracting 1 from Least Significant Bit (LSB) position in the M-bit sequence, when a difference between the N-bit sequence and the N-bit input sequence is less than −½.

27. The graphics engine of claim 22, wherein the correction module generates the M-bit resolution by setting to the M-bit sequence, when a difference between the N-bit sequence and the N-bit input sequence is within a range from −½ to ½.

28. The graphics engine of claim 22, wherein the correction module generates the M-bit resolution by adding 1 to Least Significant Bit (LSB) position in the M-bit sequence, when the difference between the N-bit sequence and the N-bit input sequence is greater than ½.

* * * * *